US 6,713,828 B1

(12) United States Patent
Chavan et al.

(10) Patent No.: US 6,713,828 B1
(45) Date of Patent: Mar. 30, 2004

(54) MONOLITHIC FULLY-INTEGRATED VACUUM SEALED BICMOS PRESSURE SENSOR

(75) Inventors: Abhijeet V. Chavan, Carmel, IN (US); Kensall D. Wise, Ann Arbor, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/465,961

(22) Filed: Dec. 17, 1999

(51) Int. Cl.[7] .............................................. H01L 29/84
(52) U.S. Cl. ...................................... 257/415; 257/419
(58) Field of Search .................................. 257/415, 419

(56) References Cited

U.S. PATENT DOCUMENTS

| | | | | |
|---|---|---|---|---|
| 6,012,336 A | * | 1/2000 | Eaton et al. ................... 73/720 |
| 6,407,437 B1 | * | 6/2002 | Burger et al. ................ 257/415 |

* cited by examiner

Primary Examiner—Jerome Jackson
(74) Attorney, Agent, or Firm—Jimmy L. Funke

(57) ABSTRACT

A semiconductor device (20) comprises a substrate (24), a first semiconductor region including a recessed area defining a first cavity (36) between the substrate (24) and the first semiconductor region, an electrical transducer (30) positioned within the first cavity (36), a second semiconductor region including a recessed area defining a second cavity (40) between the substrate (24) and the second semiconductor region, an electrical circuit (34) positioned within the second cavity (40), and at least one electrode connecting the electrical transducer (30) and the electrical device (34). The semiconductor device (20) includes a first external electrode and a second external electrode formed on the substrate (24) and a sealing layer extending around the perimeter of the cavities and sealing the semiconductor regions to the substrate (24). The sealing layer (78) includes a first electrical connection region and a second electrical connection region that are electrically isolated from each other. The first connection region electrically connects a first internal electrode to the first external electrode and the second connection region electrically connects a second internal electrode to the second external electrode through the sealing layer (78).

25 Claims, 11 Drawing Sheets

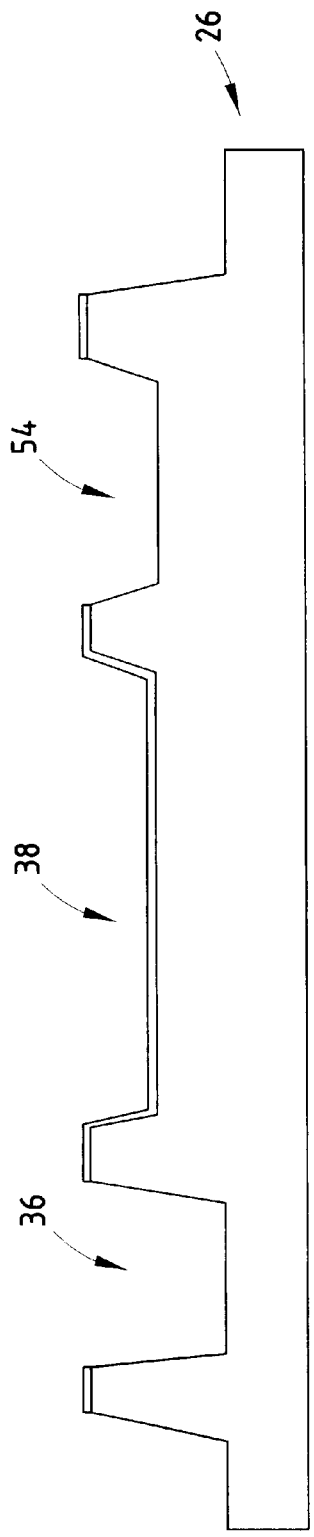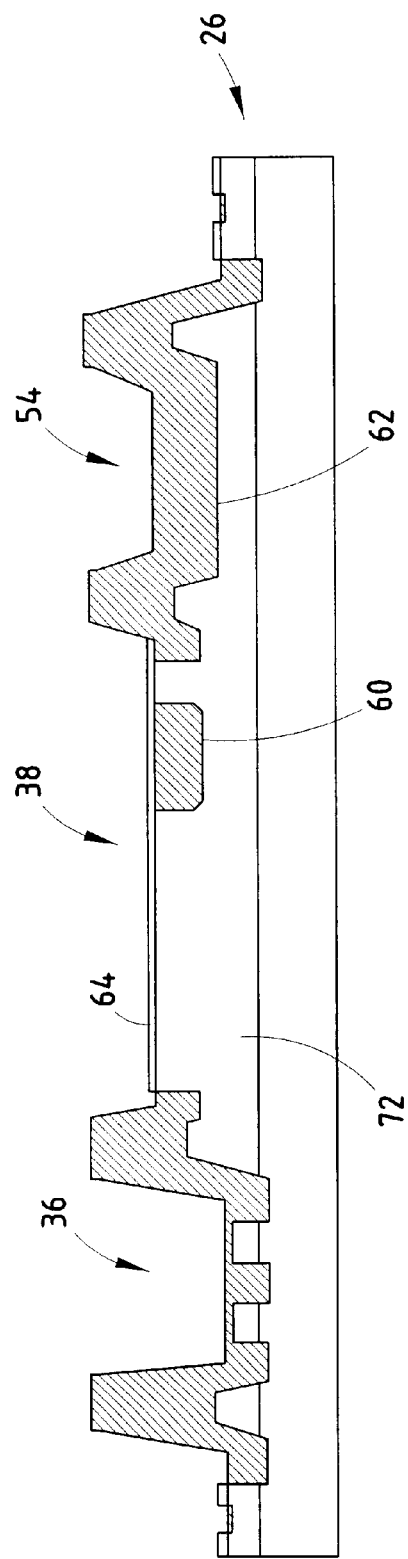

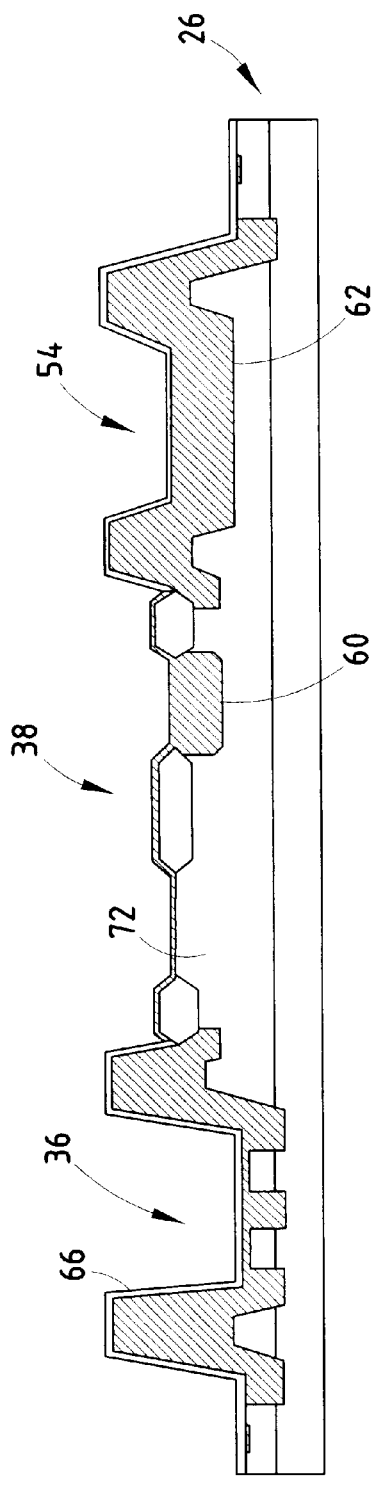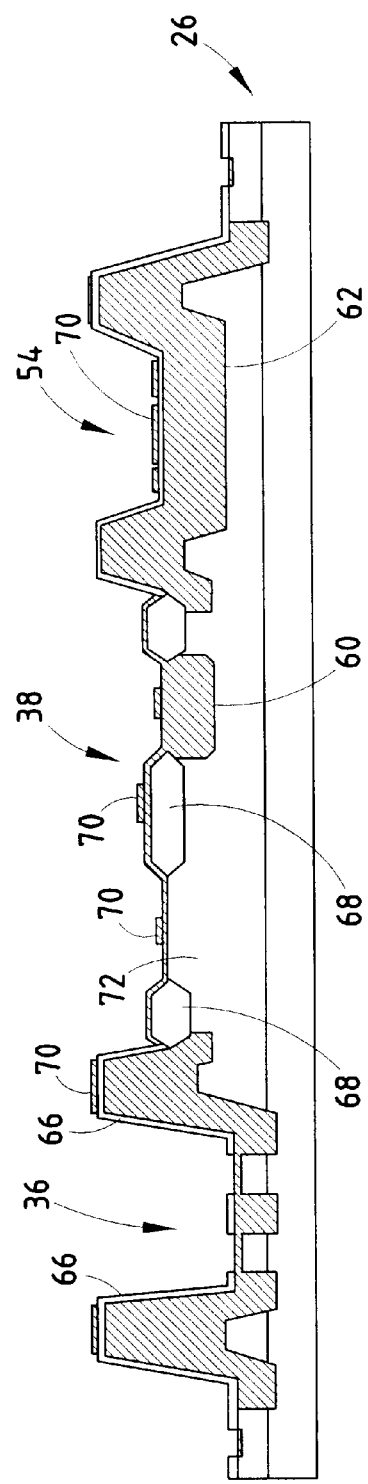

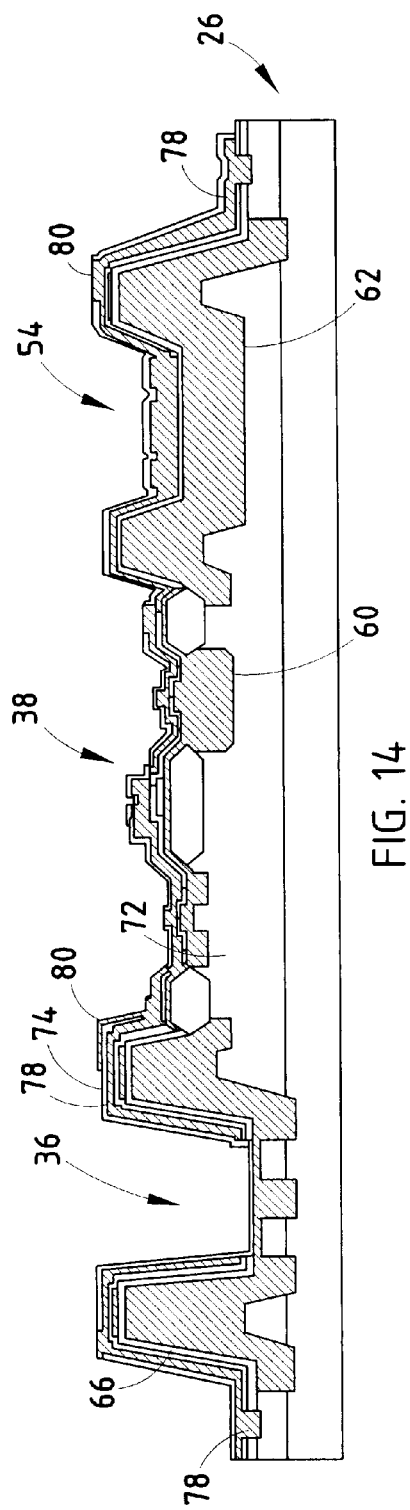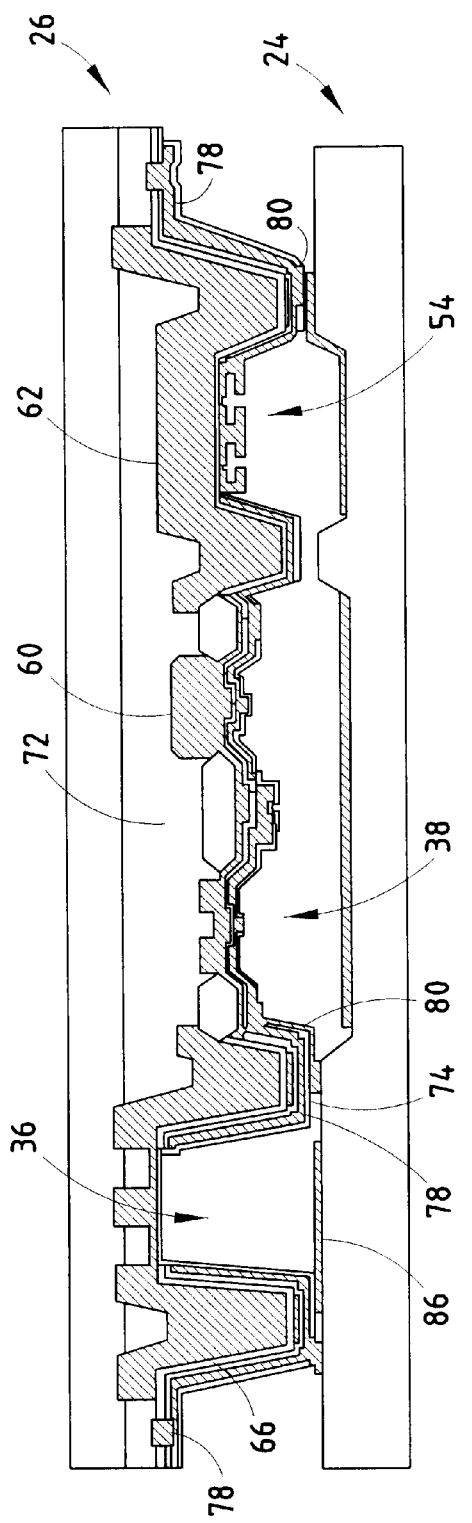

MONOLITHIC FULLY-INTEGRATED VACUUM SEALED BICMOS PRESSURE SENSOR

The United States Government may have certain rights in this invention pursuant to the grant under Contract No. DABT63-95-C-0111 from the Defense Advanced Projects Agency.

TECHNICAL FIELD

The present invention relates generally to a semiconductor device and, more particularly, to a batch processed, semiconductor device including an electrical transducer.

BACKGROUND OF THE INVENTION

The need for highly sensitive, miniature-sized pressure sensors is important for incorporation into microelectromechanical systems (MEMS) devices. Pressure sensors of this type have many applications, including uses in motor vehicles. One motor vehicle application requires the use of pressure sensors for measuring both ambient and subatmospheric pressure levels. In internal combustion engine applications, fine control of fuel metering has required that the rapidly-fluctuating pressure levels within the intake manifold of the engine be measured as well as the less-rapidly fluctuating ambient pressure levels. Sensors able to measure these pressures reliably and with adequate response time have been difficult to obtain and are typically expensive.

A majority of the currently employed pressure sensors are piezoresistive devices, well known to those skilled in the art. However, capacitive pressure sensor devices are becoming increasingly more of the focus in the industry because of their higher pressure sensitivity, lower temperature sensitivity, and reduced power consumption. Because piezoresistive devices can be more cheaply produced and are currently more reliable, they remain, however, the more popular of the known pressure sensors. Research continues on the capacitive pressure sensor devices to reduce their cost of manufacture and increase their reliability because of their inherent advantages.

Many variations of capacitive pressure sensors are known in the art. Capacitive pressure sensors typically measure pressure by the capacitive changes resulting from variations in the distance between a movable diaphragm and a substrate that occur because of pressure changes. A vacuum sealed chamber is defined in the sensor, where an internal electrode is formed on the substrate within the chamber and a second electrode is formed as part of the movable diaphragm. As the pressure outside of the chamber increases or decreases, the diaphragm moves towards or away from the substrate, and the charge on the electrodes changes giving an indication of the pressure change.

These sensors are affected by parasitics and external interference since the signal is amplified a significant distance from the transducer. What is needed is a monolithic fully-integrated pressure sensor that is cost-effective, reliable and robust, and includes an electrical circuit with the transducer. It is therefore an objective of the present invention to provide such a sensor.

SUMMARY OF THE INVENTION

In accordance with the teachings of the present invention, a semiconductor device is disclosed that includes a transducer and electrical circuit within a vacuum sealed chamber. This invention is related to some of the concepts described in U.S. Pat. No. 5,929,497, which is assigned to the assignee of the present invention and expressly incorporated herein by reference and as described in the paper, "A Monolithic Fully-Integrated Vacuum-Sealed CMOS Pressure Sensor", which is authored by the inventors of the present invention and expressly incorporated herein by reference, and which at the time of filing the subject application has not been published or otherwise publicly disclosed. This invention can be used in many applications including, for example, precision altitude measurements and microweatherstations.

The development of integrated pressure sensors containing on-chip circuitry has become a primary focus of MEMS research in order to achieve improved performance, cost reduction and realization of the system-on-chip concept for capacitive pressure sensors. Such sensors reduce the effects of parasitics and external interference because the signal is amplified in close proximity of the transducer, however, they also pose interesting challenges in merging transducer and circuit processes, maintaining testability, and achieving reliable vacuum encapsulation. Vacuum encapsulation is required in many devices to eliminate problems relating to temperature effects of gas expansion, squeeze film damping effects which limit bandwidth and problems relating to stiction during final release of the device. In addition the availability of an assembly ready device can significantly reduce packaging costs associated with hermnetic sealing requirements and permit low cost packaging to be used. The die area required for a sensor having embedded readout circuitry is typically smaller than two separate dies as used in hybrid integration, and any reliability problems associated with inter-chip interconnects are eliminated.

Any yield model for integrate d sensors containing on-chip circuitry is highly process dependent. In the past decade, process equipment has become highly automated thereby providing improved control for processes having high numbers of masking steps. The impact of this improvement in process control is seen in the success of deep-submicron process technology, which has many more masking steps than standard 1 $\mu$m CMOS and yet achieves high yield. Thus, the prospect of fabricating sensors using higher mask counts to achieve high performance while obtaining high yield is promising. Other types of semiconductor devices, such as accelerometers, gyroscopes, resonators, etc., also benefit from such on-chip circuit integration technology.

The present invention involves an integrated multi-transducer capacitive barometric pressure sensor that is vacuum-sealed at the wafer level. The interface circuitry is integrated directly with the sealed reference cavity, making the device imnmune to parasitic environmental effects. The overall device process merges BiCMOS circuitry with a dissolved-wafer transducer process, is compatible with bulk- and surface-micromachining, and employs chemical-mechanical polishing (CMP), anodic bonding, and hermetic lead transfers. The sensor achieves 15$b$ resolution and is compatible with low cost packaging. The device includes a programmable switched-capacitor readout circuit, five segmented-range pressure transducers, and a reference capacitor, all integrated on a 7.5×6.5 mm$^2$ die using 3 $\mu$m features.

The present invention provides a semiconductor device including a substrate, a first semiconductor region including a recessed area defining a first cavity between the substrate and the first semiconductor region, an electrical transducer positioned within the first cavity, a second semiconductor region including a recessed area defining a second cavity between the substrate and the second semiconductor region, an electrical circuit positioned within the second cavity, and at least one electrode connecting the electrical transducer and the electrical device.

The present invention further provides a semiconductor device including a substrate, a first semiconductor region including a plurality of recessed areas defining a plurality of transducer cavities between the substrate and the first semiconductor region, an electrical transducer positioned within each the transducer cavity, a second semiconductor region including a recessed area defining a circuit cavity between the substrate and the second semiconductor region, an electrical circuit positioned within the circuit cavity, and a plurality of electrodes connecting the electrical transducers to the electrical device.

The present invention yet provides a semiconductor device including a substrate, a first semiconductor region including a recessed area defining a first cavity between the substrate and the first semiconductor region, an electrical transducer positioned within the first cavity, a second semiconductor region including a recessed area defining a second cavity between the substrate and the second semiconductor region, an electrical circuit positioned within the second cavity, at least one electrode connecting the electrical transducer and the electrical device, and a sealing layer extending around the perimeter of the cavities and vacuum sealing the semiconductor regions to the substrate.

Additional objects, advantages, and features of the present invention will become apparent from the following description and appended claims, taken in conjunction with the accompanying drawings.

BRIEF DESCRIPTION OF THE DRAWINGS

The above mentioned and other features and objects of this invention, and the manner of attaining them, will become more apparent and the invention itself will be better understood by reference to the following description of an embodiment of the invention taken in conjunction with the accompanying drawings, wherein:

FIGS. 8 through 16 are sectional views of various fabrication steps for making the semiconductor device shown in FIG. 4;

Figure 1:
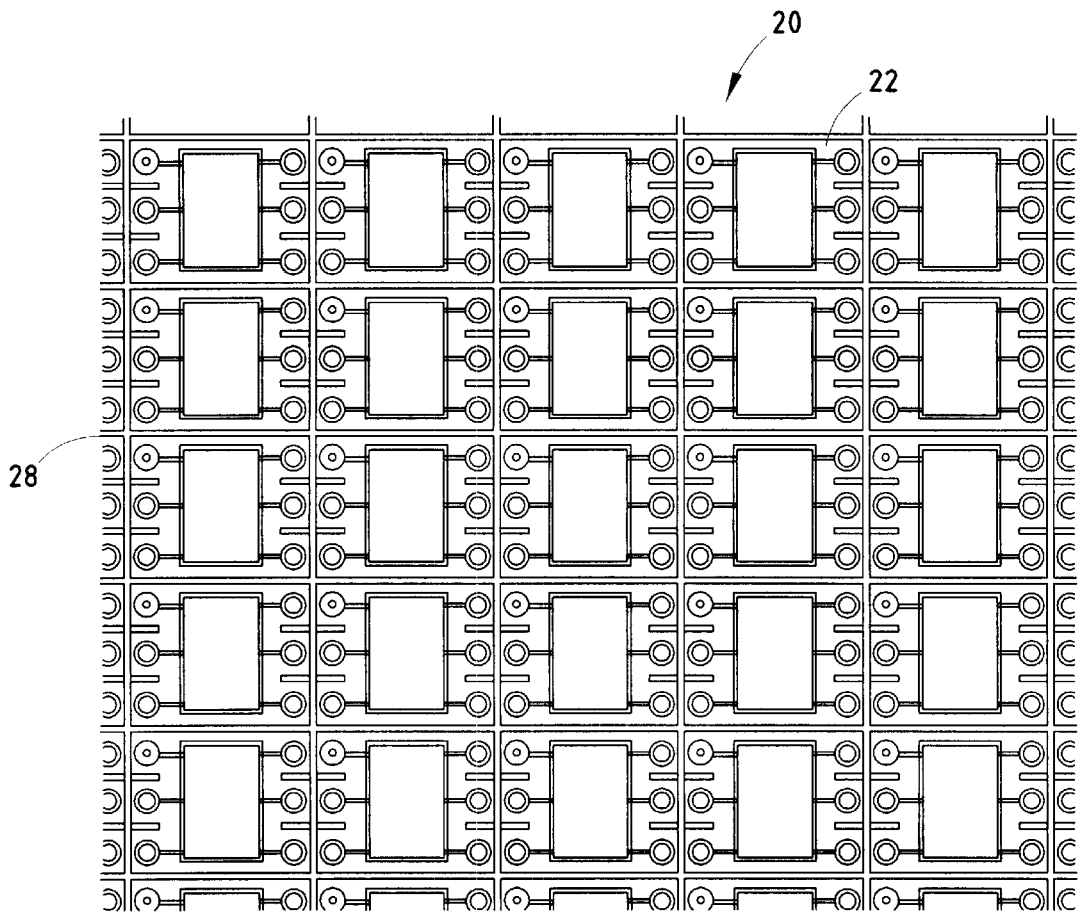
FIG. 1 is a cut-away plan view of a semiconductor wafer assembly including a plurality of separate pressure sensors fabricated on the wafer.

Corresponding reference characters indicate corresponding parts throughout the several views. Although the drawings represent an embodiment of the present invention, the drawings are not necessarily to scale and certain features may be exaggerated in order to better illustrate and explain the present invention. The exemplifications set out herein illustrate embodiments of the invention, in several forms, and such exemplifications are not to be construed as limiting the scope of the invention in any manner.

DESCRIPTION OF THE PREFERRED EMBODIMENT

The embodiments disclosed below are not intended to be exhaustive or limit the invention to the precise form disclosed in the following detailed description. Rather, the embodiments are chosen and described so that others skilled in the art may utilize their teachings.

FIG. 1 is a schematic type diagram of a micromachined, batch processed, wafer assembly 20 including a plurality of pressure sensors 22 formed on a glass substrate 24 suitable for bonding to silicon. The sensors 22 are separated from each other by dicing along lines 28. Only a portion of the wafer assembly 20 is shown, with the understanding that the wafer assembly 20 is typically circular or square in nature and accommodates a large number of sensors 22 depending on the specific diameter of the assembly 20 for a particular processing application. In one embodiment, the glass substrate 24 is SD2 HOYA or 7740 PYREX, however, other glasses suitable for anodic bonding may be equally applicable.

Figure 2:
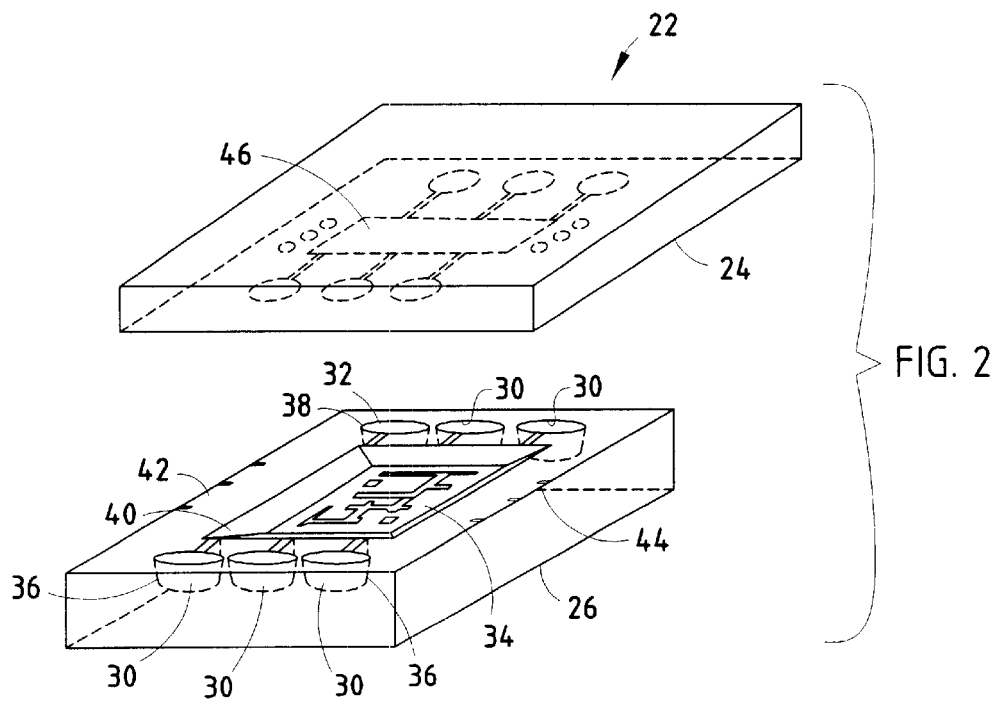
FIG. 2 is a perspective view of one of the pressure sensors separated from the wafer shown in FIG. 1.
Figure 4:
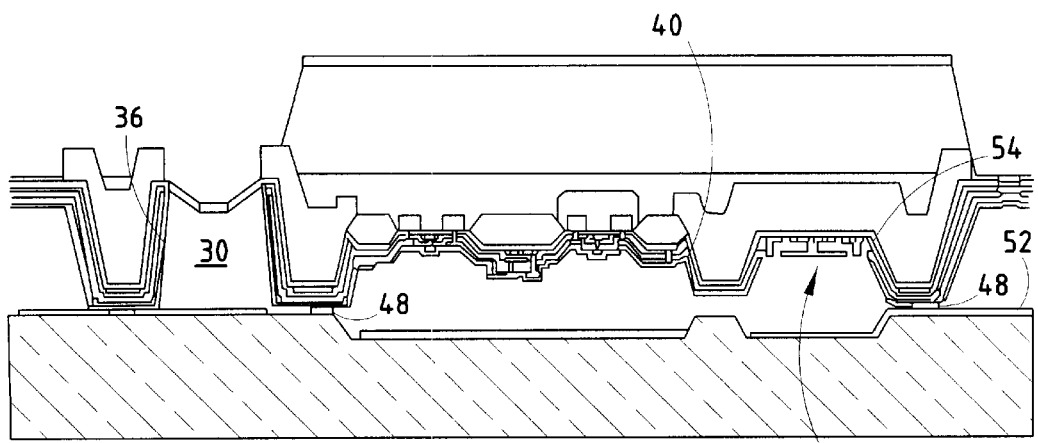
FIG. 4 is a sectional view of a pressure sensor including a pressure transducer, a circuit, and a recessed surface micromachined device.

FIG. 2 is a perspective view of one of the pressure sensors 22 separated from the assembly 20. Each sensor 22 includes five separate capacitive pressure transducers 30 of varying degrees of sensitivity to provide a pressure measurement over a wide range of pressures, reference capacitor 32, and electrical circuit 34. The number of transducers, five in this case, is variable due to the application of the sensor. The sensitivity of the individual pressure transducers 30 is determined by the relative diameter and thickness of the diaphragm in transducer 30. Most of the components of all of the sensors 22 are formed and micromachined on a common P-type silicon wafer 26 having moderate resistivity, but are not limited to this types of wafer. The wafer 26 is then electrostatically bonded to the glass substrate 24 in a batch-type process, as described in U.S. Pat. No. 5,929,497. The electrostatic bonding process is well known to those skilled in the art. A region of the silicon wafer 26 is then etched away, for example, by an EDP (ethylenediamine pyrocatechol) etch to separately define the individual sensors 22 from each other while they are still mounted on the glass substrate 24. Once the separated systems 22 are completely fabricated, the glass substrate 24 is diced along the lines 28 to separate the systems 22 from each other. The sensor 22 consists of silicon wafer 26 and glass substrate 24 bonded together anodically after the fabrication of CMOS circuit 34. The glass substrate 24 is thermally matched to silicon wafer 26 thereby reducing structural stresses. The transducers 30 and circuit 34 are located in recessed cavities on silicon wafer 26. FIG. 4 is a sectional view of a pressure system 22. The wafer 26 is etched to define cavities 36, 40, 54. Cavity 36 has the configuration as shown to conform to the semiconductor fabrication process used to make transducer 30. Cavity 40 has the configuration to conform to the semiconductor fabrication process used to make circuit 34.

Cavity 54 has the configuration to conform to the semiconductor fabrication process used to make a surface micromachined device. By recessing the electrical devices the circuit bonding anchors 42 form the highest topological features on silicon wafer 26. This allows using CMP at a later stage in the process to obtain a surface roughness of <0.50 nm on the bonding polysilicon and is crucial for a high yield on the vacuum seal.

Electrical signals are transferred from the sealed cavity to the outside world using dielectric isolated doped polysilicon leads. A selective backside anistropic etch is done to release the pressure transducers. Bonding pads are located on the glass to allow the die to be directly mounted on a PCB or MCM. Semiconductor sensing devices cannot always be placed in standard packages and most package designs have some effect on sensor performance due to externally-induced stresses and trapped-gas effects. This is especially true when the transducer measures an ambient physical quantity (such as pressure or humidity) that requires one side of the die to be directly exposed to the ambient environment. In this device, software programmability is provided to overcome any environmentally-induced shifts in system behavior. Partial dicing of the glass substrate before anodic bonding simplifies die separation prior to packaging.

Figure 6:
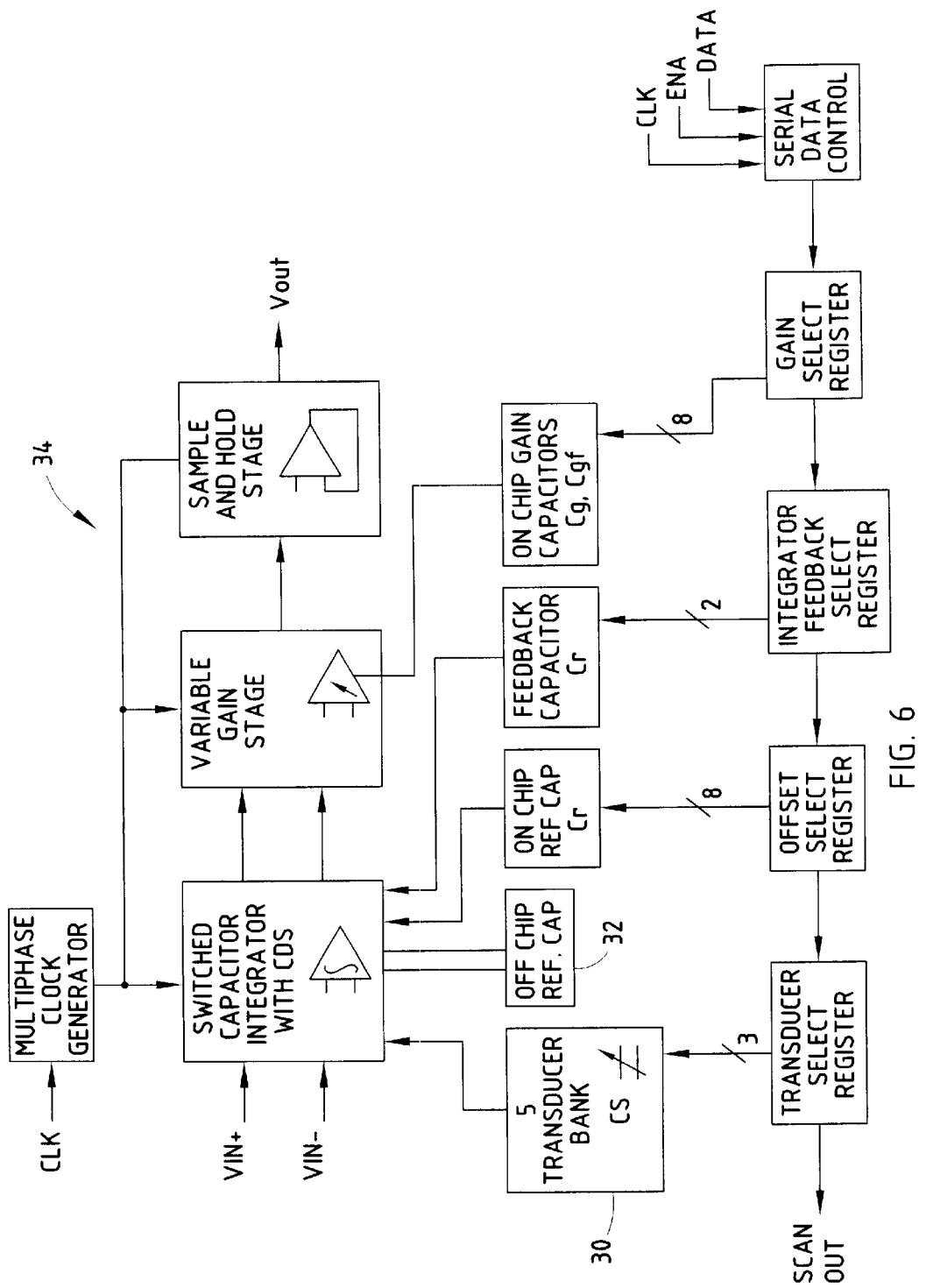
FIG. 6 is a schematic view of a pressure sensor including pressure transducers, a reference capacitor, and an electrical circuit.

The complete system architecture is shown in FIG. 6. The sensor 22 can interface to five different transducers 30, has-on-chip programmable offset and gain adjustment, buffered DC analog output, on-chip sampling clock generator and serial micro-controller interface. There are three I/O, one control, one clock, and two power lines for a total of seven interface lines $V_{in+}$ and $V_{in-}$ are typically connected to $V_{dd}$ but can be connected to other voltage levels if required. The system has additional access pins provided for debugging and also provides for connecting and external reference capacitor.

Electronic trimming is a necessity in vacuum encapsulated monolithic sensors. All the required variable offset/gain analog blocks, RAM registers, switches and capacitor/resistor arrays are included on-chip. In addition the circuit has control functionality to switch between calibration mode and operational mode. Wafer probe level testing is provided using special layout considerations to avoid expensive packaging of non-functional dies.

Since the post processing includes thermal and electric field application steps it is preferable to use discrete time analog circuits because of their higher tolerance to transistor parameter variations. In addition discrete time circuits are relatively immune to parasitic capacitances. The circuit design however has to ensure that non-linear distortion due to aliasing is prevented by making the sampling frequency greater than twice the input signal frequency also referred to as Nyquist rate. Switched capacitor readout circuits are one type of such discrete time circuits. In case of monolithic vacuum-sealed devices there is a parasitic lead resistance and capacitance involved with the signal transfer leads from inside of the sealed cavity to the outside world. This parasitic resistance and capacitance can change due to process variation. For digital signals, the output buffers are large enough to maintain rise/fall times within required specifications. For analog signals buffering using source followers is advisable. OTA's with a second output stage should be used to drive output signals.

The chip contains a three-stage programmable switched capacitor (SC) circuit (FIG. 6) that can multiplex up to five transducer elements at its input. SC circuit operation depends on the ratio of capacitances, allowing for greater process tolerance. The circuit gain can be adjusted by external programming. The programming data is input via a simple serial data interface. Programmable capacitor arrays are used for calibrating gain and offset over a wide range of transducer base capacitances and sensitivities. The analog front-end consists of a fully-differential charge integrator with a self-biased folded-cascode amplifier, which uses continuous-time current-summing common-mode feedback for DC stabilization. The clocking scheme uses correlated double sampling to suppress 1/f noise and amplifier offset effects. The output of the first stage feeds a differential gain stage with single-ended output conversion.

The sensor array consists of five different transducers 30, which cover the overall 300 Torr dynamic range of the system. One of the transducers covers the entire range at a lower sensitivity while the remaining four cover segments of the range at higher sensitivity. The range differentiation is achieved by varying the diaphragm diameters for the various transducers. Square diaphragms can also be used instead of circular diaphragms. Using programmable transducer selection provided on circuit 34, the global device is sampled to coarsely determine what range the ambient pressure is in. Then circuit 34 switches in the appropriate higher sensitivity transducer to obtain a high-resolution reading. A fixed value mechanical reference capacitor is included for use with the differential switched capacitor readout circuit. This circuit accomplishes a.capacitance voltage conversion. Other circuits can be used to achieve the same function.

Figure 7:
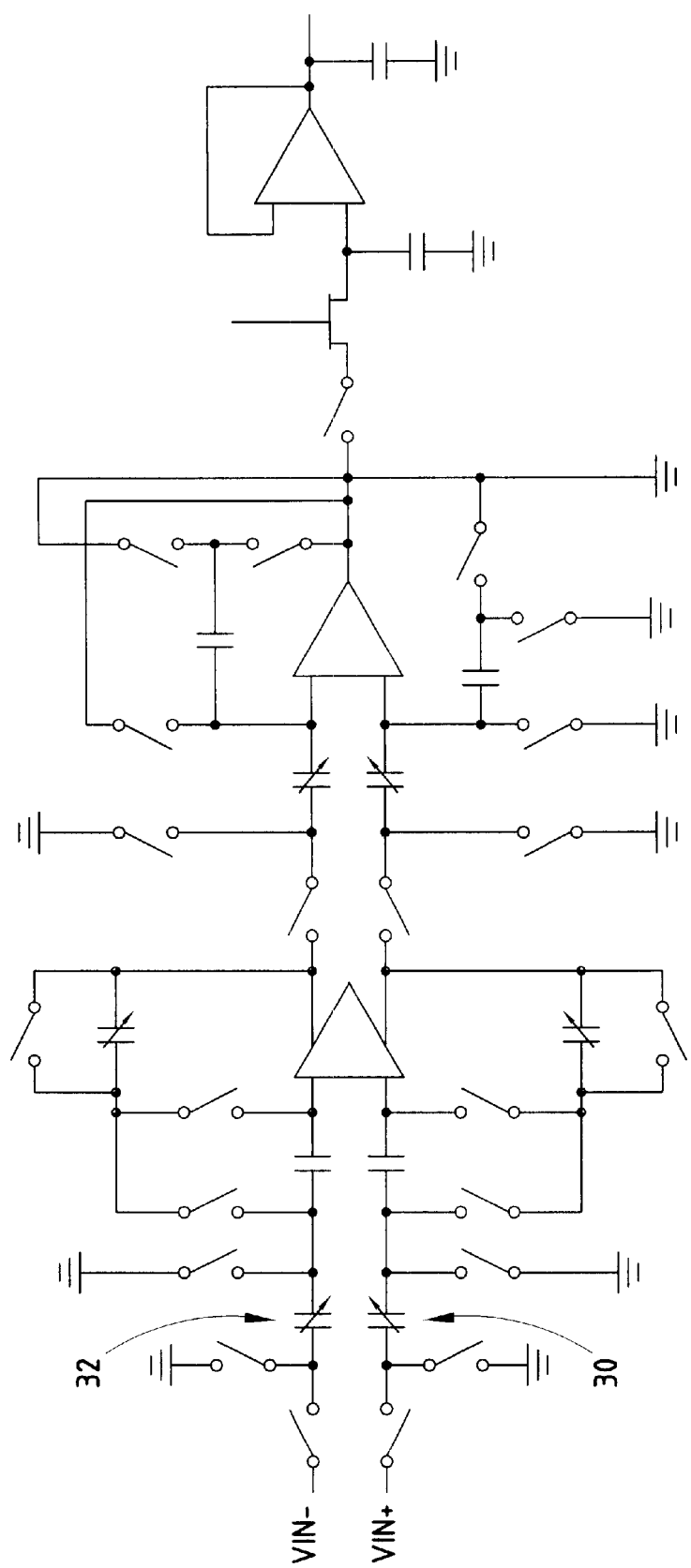
FIG. 7 is a schematic view of a capacitance to voltage conversion circuit shown in FIG. 6.

Each of the transducers 30 provide an electrical indication of the pressure around the transducer 30. Each transducer 30 includes at least one electrical lead 50 (FIG. 3) connected to circuit 34. FIG. 6 is a schematic diagram of circuit 34 included in one of the sensors 22. Circuit 34 includes a capacitance to voltage conversion circuit, which receives the signals from transducers 30 and reference capacitor 32. FIG. 7 shows the location of transducer 30 and reference capacitor 32 in the schematic diagram of the capacitance to voltage conversion circuit. Each of transducers 30 provides electrical output signals indicative of the surrounding pressure on the leads 50 to circuit 34 that processes the signals to display the appropriate output signal on a suitable display (not shown). Reference capacitor 32 provides a reference pressure signal to circuit 34 indicative of a constant reference capacitance.

The transducers consist of 4 $\mu$m thick membranes with a rigid bossed center. The transducers are formed in 10.2 $\mu$m deep recessed cavities. After the vacuum sealing and release in EDP the transducers are deflected by about 9.8 $\mu$m and operate with a gap of about 0.5 $\mu$m. The rigid center does a first order linearization of the-transducer capacitance change. A metal (Ti/TiN/Al) electrode on the moving diaphragm forms one plate of the capacitor and another metal electrode (Ti/Pt/Au) on the glass substrate forms the other plate of the capacitor.

Wafer 26 is electrostatically bonded to the substrate 24 by a polysilicon sealing layer 48 that extends completely around the cavities. Because the assembly 20 is fabricated within a vacuum chamber, the cavities are sealed as a vacuum by the layer 48. Although sealing layer 48 is being made of polysilicon in a preferred embodiment, other materials or combination of materials can make up the sealing layer 48. For example, instead of polysilicon, silicide, e.g. silicide of molybdenum, tantalum, tungsten, polysilicides, refractory metals, or combinations thereof can also be used.

Prior to the wafer 26 being sealed to the substrate 24, a series of metal electrode layers, such as Titanium-Platinum- Gold (Ti/Pt/Au) layers, are formed on a surface of the substrate 24 and etched to define internal electrical connections between transducers 30, reference capacitor 32, and circuit 34, and electrical connections to external leads 52 outside of the cavities. The external leads 52 are electrically connected to circuit 34. An electrical connection between circuit 34 and external leads 52 must be provided without affecting the seal integrity. The polysilicon layer 48 also acts as an electrical connection between circuit 34 and external lead 52 through the seal provided by layer 48. Therefore, layer 48 maintains the vacuum integrity of the cavities while at the same time providing an electrical connection through the vacuum seal.

Figure 3:
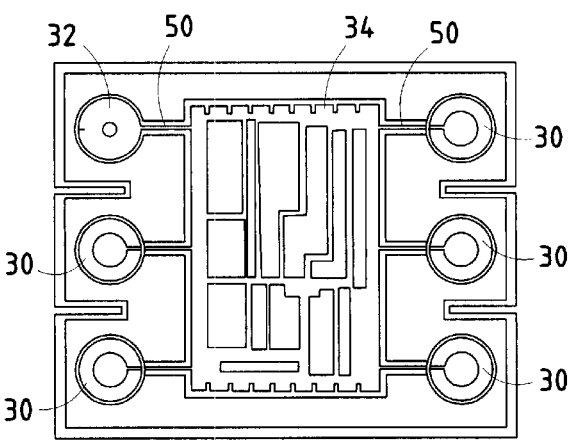
FIG. 3 is a top view of the silicon side wafer of one of the pressure sensors separated from the wafer shown in FIG. 1.

Design for testability is an important consideration for monolithically integrated sensors. Due to the presence of a non-standard sensor, most sensor have special packaging needs, which are expensive. These contribute to over 50% of the cost of the final device. Under such a situation it is imperative that pre-packaging testing be elaborate and foolproof to avoid packaging faulty sensor parts. Thus this design has incorporated features to allow wafer level probe testing. There are two stages at which the wafer is tested, one is test of the silicon wafer before the anodic bonding and the second is testing of the bonded and released wafer. As can be seen in FIG. 3 an entire set of pads is provided on the inside of the bonding anchor rim where probes can make contact. This allows running test vectors for the digital part of the circuit. To test the analog circuits, switches are provided which completely isolate the transducer and reference capacitor from the circuit. In its place, on-chip fixed capacitors are switched in. This allows verifying the functionality of the entire readout circuit. In addition to this the programmable registers can be tested by configuring them into a scan chain. Data can be shifted in and tested at the output. The post bonding wafer probing involves direct probing of the metal pads on the glass. All the tests, which are performed before the bonding, can also be performed after bonding. In addition tests for the mechanical transducer are performed using higher voltages at the interface pins $V_{in+}$ and $V_{in-}$.

Figure 5:
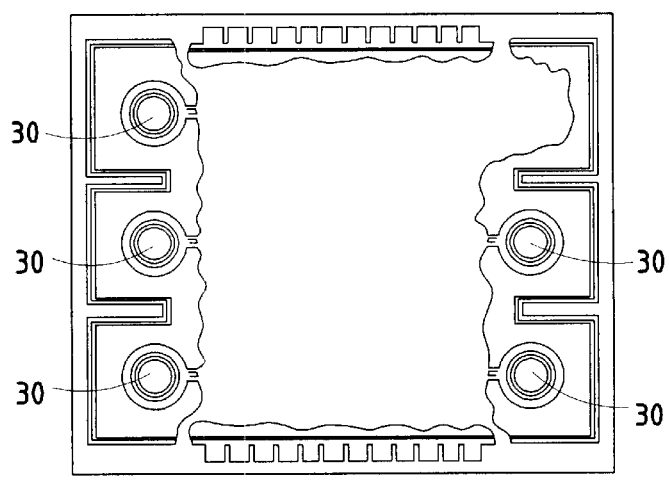
FIG. 5 is a top view of one of the pressure sensors after EDP release.

The process uses 20 masks: 15 for the 2P/2M p-well circuitry, three additional masks for the transducers, and two for the glass processing. The process first etches recesses in a silicon wafer, subsequently growing a thick n-type epi layer in which the circuitry will be formed. The transducers are formed in recessed cavities 8 μm deep, while the circuitry is fabricated in separate 2.5 μm-deep cavities (FIG. 4). Thus, the anchors used for anodic bonding form the highest topological features on the silicon wafers. FIG. 4 shows a cross-section of the overall device, while FIG. 5 shows a completed device. FIG. 3 shows the silicon die before anodic bonding. The bonding anchor areas also contain polysilicon lead transfers from the vacuum-sealed cavity to the outside world. The second-level polysilicon is 2 μm thick; colloidal-silica-based CMP is used to remove any surface imperfections and allow vacuum sealing. Other planarization methods can also be employed. Ti/Pt/Au metallization is used on the glass, and TiN is used in the circuit contacts to prevent junction spiking during anodic bonding. Back-side masking with corner compensation is used over the circuit area while the remaining portions of the wafer are selectively etched to realize the final device.

The transducers are formed using two diffused boron etch-stops: one for the rims/bosses and one for the diaphragms. Metal islands on both wafers provide compression-bonded low-resistance contacts to bring the leads out to pads on the upper glass surface. The process gives careful consideration to step coverage in the recessed areas and to the CMOS thermal budget, achieving high yield. With three additional masks the process can also be used to form vacuum-encapsulated surface micromachined devices on the same die. The second-level polysilicon is then common to the circuitry (poly-poly capacitors), the lead transfers, and the surface micromachined devices. The surface micromachined devices are released in HF or BHF just prior to the anodic bonding step. Resonators, gyros, and accelerometers have been successfully fabricated on test dies included on the pressure sensor mask set.

A compressed process flow is given in FIGS. 8 through 16. The process starts with two wafers: one silicon wafer and a glass wafer. A dielectric coated silicon wafer can be used in place of the glass wafer. Recessed cavities are created in the silicon, recessed cavity 36 for the transducer, recessed cavity 38 for the circuit, and recessed cavity 54 for the surface micromachined device. Initially, a thermal oxide is grown and etched with BHF in the circuit area using a mask to define the circuit area and scribe-grid/alignment mark area. Additional thermal oxide is next grown. The transducer recess area and inter-die channel area is then patterned and the oxide is etched in this area. After stripping the photoresist, a recess is etched in the silicon using a directional anisotropic etchant such as KOH. At this time, only the transducer area is etched because circuit area is covered with oxide. A timed unmasked BHF etch is then performed, which removes all the oxide from the circuit and the scribe-grid areas, leaving an oxide mask only in the non-circuit/nontransducer areas. A further silicon anisotropic etch is then performed. The transducer and circuit areas are both simultaneously but selectively etched. This gives a total transducer etch depth of about 8 μm and circuit depth of about 2 μm. All the oxide is then stripped, and the wafer is thoroughly cleaned using a double piranha ($H_2SO_4:H_2O_2$ [1:1]) clean. Typically, a KOH-type anisotropic etchant can roughen the surface, making it unsuitable for circuit fabrication. This process circumvents this by growing a phosphorus-doped vapor phase epitaxial layer after the KOH recess has been defined, thereby re-establishing a planar surface suitable for circuit fabrication.

The epi layer can sometimes exhibit non-uniform growth along the cavity edges due to a variation of the gas flows in the recessed cavities. A chemical-mechanical polishing (CMP) step is performed to planarize any non-uniformities and round the edges. The appropriate slurry for polishing is chosen to avoid the possibility of contamination from any slurry residue or particulates, which remain after the post CMP cleaning.

Next referring to FIG. 9, P-well 60 is patterned and implanted. A high energy implant is used to form a retrograde well, which has superior latch-up resistance and is less susceptible to punchthrough. Doubly-ionized boron is used as the dopant species. A thermal wet oxide is grown and patterned as a mask for deep boron diffusion. The backside of the wafer is protected with photoresist before etching the oxide. This prevents any unnecessary doping of the wafer backside. These areas define P++ etch stop areas in the transducer and the isolation region for the bipolar transistors. P-well area 60 remains masked during the initial boron pre-deposition step. This is a solid-source boron diffusion where surface reaction with boron trioxide is used to introduce boron into the silicon. Liquid source boron doping can also be used to dope the wafers.

A drive-in step is done next to obtain P++ region 62. P-well 60 is also driven-in during the drive-in step. Thermal masking oxide 64 is then grown and patterned for shallow boron diffusion. A shallow boron diffusion followed by a dilution step provides a diffused region with surface concentration adequate for an etch stop.

In FIG. 10, dielectric layer 66 is deposited and partially etched from the field areas during dry etching. 500 Å of $SiO_2$ is left in the field implant areas after the etch. Field oxide 68 is grown, after which the masking stack is stripped from the circuit area only.

In FIG. 11, a sacrificial oxide is grown followed by two independent patterned threshold implants for the n-channel and p-channel devices. This is followed by the growth of a gate oxide and deposition of gate poly 70, which is N+ doped in a $POCL_3$ environment.

Figure 17:
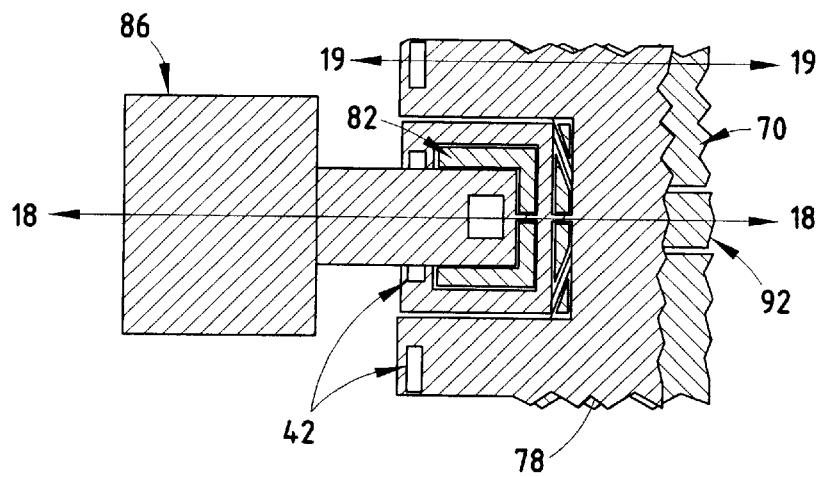
FIG. 17 is a top view of a lead transfer of the present invention.
Figure 18:
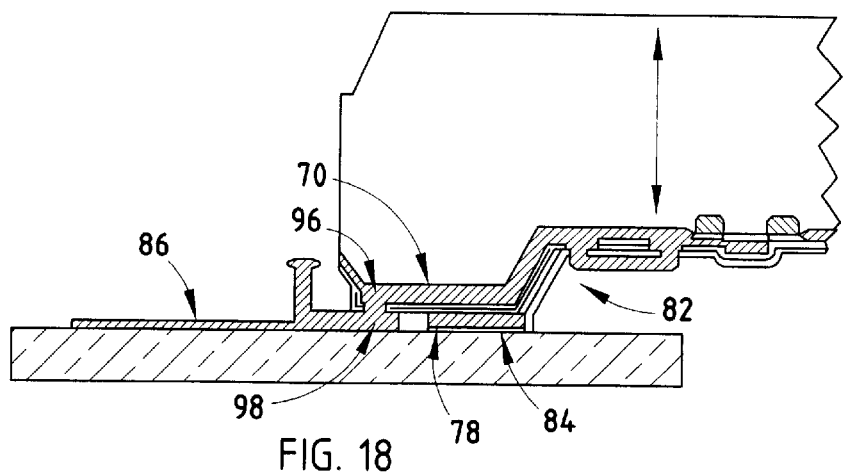
FIG. 18 is a sectional view of the lead transfer of FIG. 17 through line 18—18.
Figure 19:
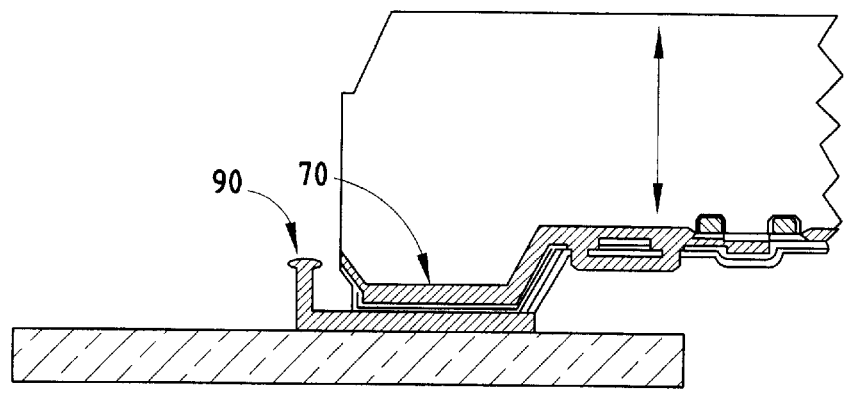
FIG. 19 is a sectional view of the lead transfer of FIG. 17 through line 19—19.

A thin film of $P_2O_5$, which is deposited on the surface during this reaction, is stripped in BHF. The same polysilicon layer forms the lower lead transfer interconnect layer on the anchors as shown in FIGS. 17 through 19. The polysilicon deposition is to give a smooth uniform polysilicon layer, which is helpful in maintaining the planarity in the lead transfer areas. The polysilicon is then dry etched. This is a critical etch for the anchor areas where the signal lead polysilicon is isolated from the rest of the polysilicon (which is electrically floating) on the anchor. The gap is subsequently re-filled with dielectric. Thus it is necessary to have reasonably straight side-wall profile. A chlorine-based polysilicon etch is preferred because it gives a better vertical side wall profile as compared to fluorine based etches. This can avoid void formation in the subsequent isolation dielectric refill. The polysilicon is retained on the bossed areas of the transducer, making the boss more rigid.

Dielectric stack 70 is patterned in the transducer area such that the stack is left on the bossed area of the pressure sensor. The bossed area now has a stack of dielectric/Poly-1.

Figure 12:
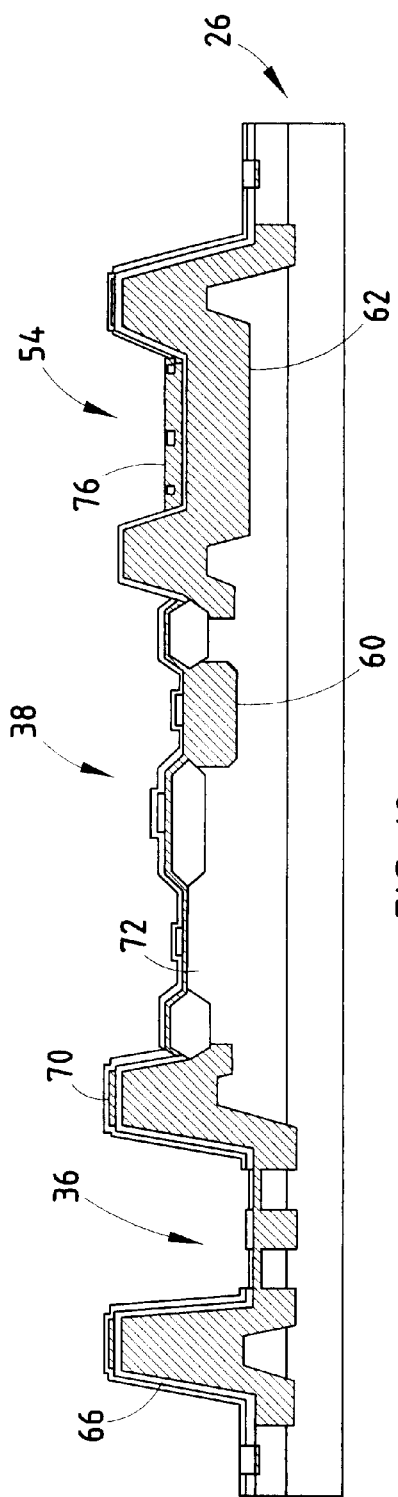

In FIG. 12, second dielectric layer 74 is then deposited and patterned such that it is left on the bossed area of the transducer and the anchor area. In case of a surface micromachined device, second sacrificial oxide 76 is deposited and patterned next. This is followed by a thermal capacitor oxide layer. A contact etch through second layer 74 to open the poly2-to-poly1 contact shown in FIG. 18 is done next. In case of a surface micromachined device the contact opening through sacrificial oxide 74 is done next.

Figure 13:
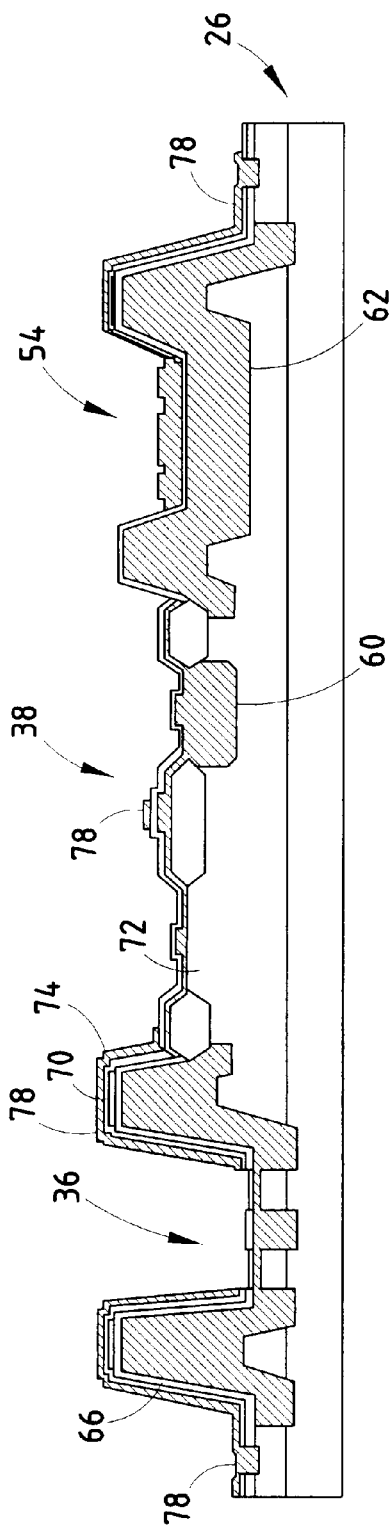

In FIG. 13, poly-2 78 is deposited and doped in a $POCL_3$ environment. A protective dielectric layer is deposited and patterned using a dry/wet etch such that it is left only on the circuit area and the surface-micromachined transducer area. Image reversal of the initial circuit recess mask is used for lithography. The second level polysilicon is subjected to CMP (chemical mechanical polishing) to remove surface imperfections and allow vacuum sealing. After CMP a careful cleaning is done. The slurry used for this step should be alkali ion free. After CMP and cleaning, second dielectric stack 74 is etched and the second level polysilicon is patterned in the circuit area. For use in high speed circuits where the polysilicon resistance and parasitic capacitance may be a concern, one can silicidize the polysilicon using a high-temperature-compatible metal.

This is followed by source-drain implants for P and N type devices as shown in FIG. 14. Next a CVD oxide is deposited and doped with phosphorus. Contacts are opened in the circuit area and the CVD oxide is etched away on the transducer as well as any surface micromachined device using the same masking step. The metal mask is patterned followed by metal deposition and liftoff. Metallization 80 is a sandwiched layer of Al:TiN:Ti. To prevent spiking, during anodic bonding, where temperature is 380° C., a passive barrier of TiN is used. Other metals/alloys like TiN can also be used. This is followed by LTO deposition 84 and patterning of the second metal mask. The LTO serves as a mask against lateral EDP etching for about 3 hours In FIG. 15, an SF6-based etch is used to etch the patterned LTO and open compression bond contact areas. There should be no undercut of the photoresist during this etch. Cr/Au is used for the second-level metallization, primarily as metal on the transfer leads to form the compression bonds 98 (FIG. 18). A selective release process' has been developed for the surface micromachined devices. Due to presence of the circuit and the etched features on the bonding anchor, a blanket HF release cannot be performed. The second level poly etch is done using a special mask. At this point in the process the second level poly is covered with a previously deposited layer of oxide, which is dry etched first followed by a dry etch for the polysilicon. A mask for the release area is patterned followed by Cr/Au metallization and liftoff. A double Cr/Au sputter is done for the metallization due to the complex topology. After lift-off, the metallization is present over the entire device except in the release area. For release etches under 20 minutes, this is adequate protection. Another issue is that the process sequence avoids contact of any metal with the device structural polysilicon. If this occurs, the polysilicon can get attacked during the subsequent HF release. Finally, after the release the metal is stripped, the device is treated in methanol and dried. Critical $CO_2$ drying may need to be employed depending on the type of structure. The HF release is required for large flat structures such as plates. For structures such as comb fingers or ring structures where the ratio of the open area to that of the polysilicon area is $\geq 1$, a BHF etch with a photoresist mask instead of the metal mask described above is used.

Ti/Pt/Au metallization 86 is used on the glass side. The Ti is used for adhesion and to enable gettering of out-diffusing oxygen from the glass. After the individual processing of the silicon and glass wafers, they are anodically bonded in vacuum at wafer level. The bonding is done in incremental voltage steps.

Figure 16:
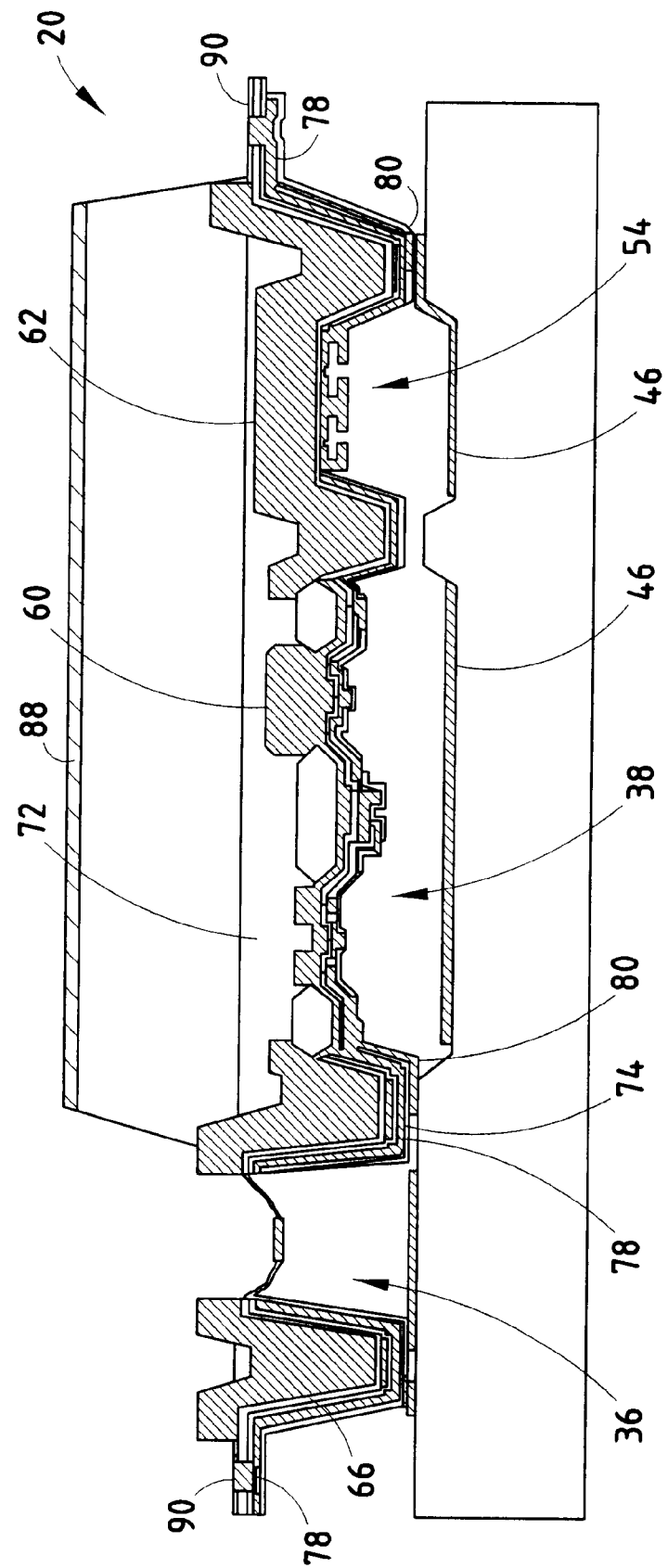

In FIG. 16, a backside masking 88 is used to protect the back of the circuit area during the following wafer dissolution steps. This is required since all the silicon has to be etched from the back of the transducer area but a thick silicon structure has to be maintained in the area where the circuit is present. The transducer area has a P++ etch stop, whereas the circuit area has no such etch stop. Cr/Au metallization is used to form the masking pattern on the backside. Other masking materials can also be used. The shape of the masking pattern is critical because the circuit area has convex corners, which etch at a much faster rate. The mask design provides for corner compensation to avoid undercutting the corners, after which the wafer is thinned in HF-Nitric to etch 300 μm of silicon and dissolved in EDP to provide the final device. Metal islands on both wafers provide low-resistance compression bonded contacts 90 to bring the leads out to the glass surface. The surface micromachined device requires 3 additional masks. In that case, the second-level polysilicon is common to the circuit (polypoly capacitors), the lead transfers, and the surface micromachined devices. The technique provides an effective way to vacuum encapsulate resonant devices or other devices which need controlled pressure damping for operation. To verify the feasibility of this approach resonators, gyroscopes and accelerometers were fabricated on test dies included on the same mask set. In addition, the circuit is integrated monolithically and has internal metallic ground shielding which reduces concerns about parasitics and RF/EMI interference.

One of the important aspects during design was the protection of the active devices from any damage due to anodic bonding. A special metal mask is included on the glass to block the electric field from the circuit area. This is accomplished by ensuring that the metal mask is in contact with the bonding polysilicon. Special metal-2 tabs are provided on the bonding polysilicon which contact the glass metal mask during bonding. The location of the tabs 44 on the silicon side can be seen in FIG. 3. Another important structural consideration concerns the input signal lines which are connected to transistor gates and source/drain regions. These lines must be connected to the silicon bulk during anodic bonding to prevent any field between the gate poly and the underlying bulk as well as the source/drain junctions and bulk. The requirement is complicated by the need to test the IC at wafer probe level before anodic bonding.

A metal-2 jumper segment is used to connect the internal wafer probe pads to the poly-1 line which forms the lead transfer. Thus before metal-2 deposition the signal lines are floating and wafer probe test can be done. The poly-1 lines short to poly-2 in the lead transfer structure as seen in FIG. 18. The signal comes out on poly-2 lines which are shorted to the substrate to form the bonding tab. This satisfies the requirement during bonding. Now for normal operation of the final device the signal lines must be isolated again. This is achieved when the undoped silicon, where the bonding tab has made contact, is dissolved during the EDP etching.

Referring now to FIGS. 17 through 19, lead transfer 92 uses two levels of polysilicon to bring the electrical signals from inside the sealed cavity to the outside. In FIG. 18, a first cross-section of FIG. 17, the electrical signal is transferred from metal-1 80 to metal-2 82 and back to metal-1 80. Metal-1 80 makes contact to first level polysilicon 70 through a contact opening. First level polysilicon 70 then makes contact with second level polysilicon 78 at contact area 96 outside the sealing ring. In FIG. 19 which shows the sealing area, a second cross-section of FIG. 17, first level polysilicon 70 and second level polysilicon 78 do not make contact and there is no lead transfer in this area.

The final device as seen from the silicon side is shown in FIG. 5. It consists of five heavily deflected diaphragms and one reference capacitor. The isotropic HF-Nitric etch used before the EDP etch to thin the silicon in the transducer area yielded acceptable results. During the isotropic etch, silicon is etched selectively from the back of the transducer area. This also causes a lateral etch in the horizontal direction. To accommodate the uncertainty related to the lateral etch rate a margin is left from the edge of the circuit area as can be seen in FIG. 3. This margin can be reduced by using a deep RIE (DRIE) backside etch instead of the isotropic backside etch. The same issue as described above is encountered in the width of the bonding anchor in the polysilicon lead transfer area. Here it is important to completely release the bonding tabs after the EDP etch as shown in FIG. 19. The constraint is that in doing so it is important that the etch not break into the circuit area. To accomplish this using an isotropic etch for thinning followed by EDP, the width of the bonding anchor in the lead transfer area should be sufficiently wide.

One of the important considerations during design was the protection of the active devices from any damage due to anodic bonding. A special metal mask 46 is included on the glass substrate to block the electric field from the circuit area. This is accomplished by ensuring that the metal mask is in contact with the bonding polysilicon. Special metal-2 tabs are provided on the bonding polysilicon, which are in contact with the glass metal mask during bonding. The location of the tabs of the silicon side can be seen in FIGS. 3 and 4.

A monolithic integrated vacuum-sealed active pressure sensor was successfully fabricated using a hybrid bulk/surface micromachining process. The test results show that noise interference levels from external factors can be substantially reduced using this technique giving a resolution of 24 m Torr of pressure and 0.5 fF capacitance resolution. The device is assembly ready due to the vacuum encapsulation at wafer level, thereby allowing significant cost reduction in the secondary package requirements. The process lends itself to batch fabrication with minimal amount of modification to a CMOS process. The principals and designs of the capacitive pressure sensor 22 discussed above are extended to surface micromachined device 56, for example, a resonator, a gyro, and an accelerometer as shown in FIG. 4.

Additional information regarding fabrication of transducers 30 using bulk micromachining technology or circuit 34 using surface micromachining technology, and multi-lead vacuum packaging is described in U.S. Pat. No. 5,929,497.

Figure 20:
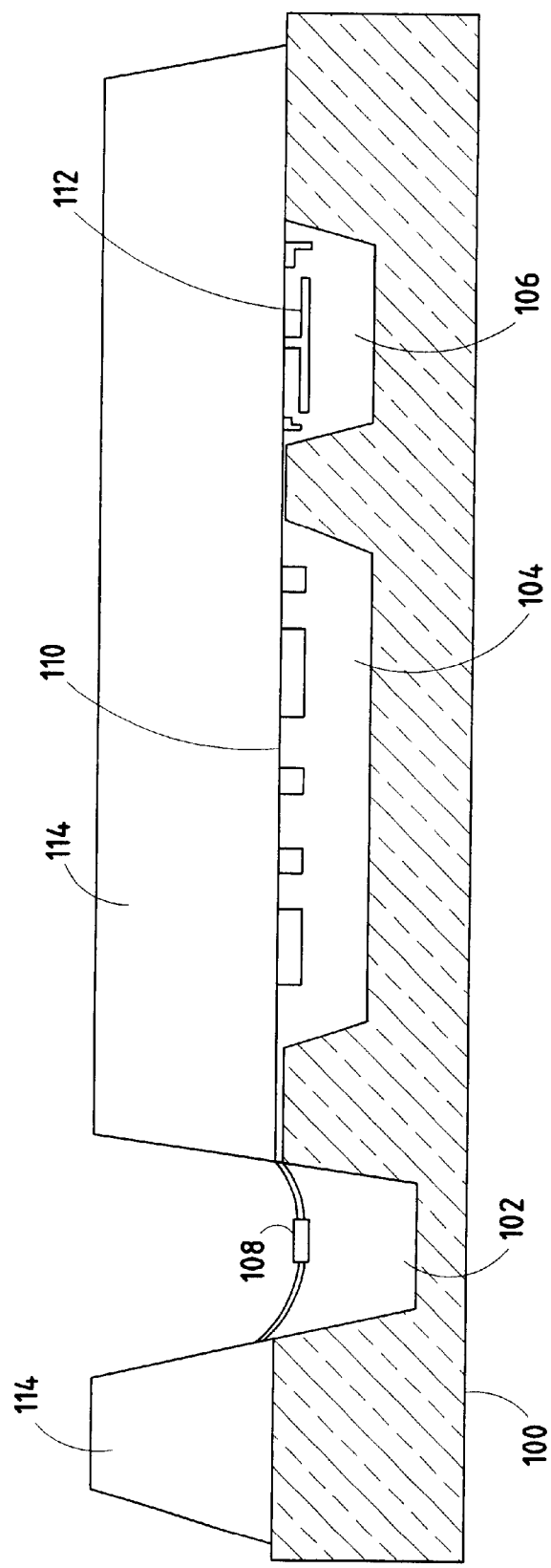
FIG. 20 is a sectional view of a second embodiment of the present invention.

Another embodiment of the present invention is shown in FIG. 20. In this embodiment glass substrate 100 contains recesses 102, 104, 106, for pressure sensor assembly 108, circuit 110, and surface micromachined device 112, respectively. Pressure sensor assembly 108, circuit 110, and surface micromachined device 112 are located on a generally planar surface on silicon wafer 114. As mentioned above a dielectric coated silicon wafer can be used in place of glass substrate 100. When a dielectric coated silicon wafer is used in place of the glass substrate, low temperature fusion bonding is used in place of the anodic bonding.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains. For example, the present invention has been described herein with certain dimension and tolerance values. Those skilled in the art will recognize, however, that other dimension and tolerance values may be used, typically dependent in large part upon the particular application and design goals, without departing from the scope of the present invention.

What is claimed is:

1. A semiconductor device comprising:
   a substrate;
   a first semiconductor region including a recessed area defining a first cavity between said substrate and said first semiconductor region;
   an electrical transducer positioned within said first cavity;
   a second semiconductor region including a recessed area defining a second cavity between said substrate and said second semiconductor region;
   an electrical circuit positioned within said second cavity; and
   at least one electrode connecting said electrical transducer and said electrical circuit.

2. The semiconductor device of claim 1, further comprising a first external electrode and a second external electrode formed on said substrate.

3. The semiconductor device of claim 2, further comprising a sealing layer extending around the perimeter of said cavities and sealing said semiconductor regions to said substrate, said sealing layer including a first electrical connection region and a second electrical connection region that are electrically isolated from each other, said first electrical connection region electrically connecting a first internal electrode to said first external as electrode and said second electrical connection region electrically connecting a second internal electrode to said second external electrode through said sealing layer.

4. The semiconductor device of claim 1, wherein said electrical transducer is a bulk micromachined device.

5. The semiconductor device of claim 1, wherein said electrical transducer is a surface micromachined device.

6. The semiconductor device of claim 1, wherein said electrical transducer is a pressure transducer.

7. The semiconductor device of claim 1, wherein said electrical transducer is a resonator.

8. The semiconductor device of claim 1, wherein said electrical transducer is a gyro.

9. The semiconductor device of claim 1, wherein said electrical transducer is an accelerometer.

10. The semiconductor device of claim 1, wherein said electrical circuit includes a programmable switched capacitor integrator.

11. The semiconductor device of claim 1, wherein said substrate is a glass substrate.

12. The semiconductor device of claim 1, wherein said substrate is a dielectric coated silicon layer.

13. A semiconductor device comprising:

a substrate;

a first semiconductor region including a plurality of recessed areas defining a plurality of transducer cavities between said substrate and said first semiconductor region;

an electrical transducer positioned within each said transducer cavity;

a second semiconductor region including a recessed area defining a circuit cavity between said substrate and said second semiconductor region;

an electrical circuit positioned within said circuit cavity; and a plurality of electrodes connecting said electrical transducers to said electrical circuit.

14. The semiconductor device of claim 13, further comprising a first external electrode and a second external electrode formed on said substrate.

15. The semiconductor device of claim 14, further comprising a sealing layer extending around the perimeter of said cavities and sealing said semiconductor regions to said substrate, said sealing layer including a first electrical connection region and a second electrical connection region that are electrically isolated from each other, said first electrical connection region electrically connecting a first internal electrode to the first external electrode and said second electrical connection region electrically connecting a second internal electrode to the second external electrode through the sealing layer.

16. The semiconductor device of claim 13, further comprising a third semiconductor region including a recessed area defining a reference cavity between said substrate and said third semiconductor region and further comprising a reference device positioned within said reference cavity.

17. The semiconductor device of claim 13, wherein said electrical circuit includes a programmable switched capacitor integrator.

18. The semiconductor device of claim 13, wherein one of said plurality of electrical transducers covers the entire range of said device at low sensitivity and the remaining electrical transducers cover segments of the range at high sensitivity.

19. A semiconductor device comprising:

a substrate;

a first semiconductor region including a recessed area defining a first cavity between said substrate and said first semiconductor region;

an electrical transducer positioned within said first cavity;

a second semiconductor region including a recessed area defining a second cavity between said substrate and said second semiconductor region;

an electrical circuit positioned within said second cavity;

at least one electrode connecting said electrical transducer and said electrical circuit; and a sealing layer extending around the perimeter of said cavities and vacuum sealing said semiconductor regions to said substrate.

20. The semiconductor device of claim 19, further comprising a first external electrode and a second external electrode formed on said substrate.

21. The semiconductor device of claim 20, wherein said sealing layer includes a first electrical connection region and a second electrical connection region that are electrically isolated from each other, said first electrical connection region electrically connecting a first internal electrode to said first external electrode and said second electrical connection region electrically connecting a second internal electrode to said second external electrode through said sealing layer.

22. The semiconductor device of claim 19, wherein said electrical circuit includes a programmable switched capacitor integrator.

23. A semiconductor device comprising:

a first semiconductor region;

second semiconductor region;

a substrate having a first recessed area and a second recessed area, said first recessed area defining a first cavity between said substrate and said first semiconductor region, said second recessed area defining a second cavity between said substrate and said second semiconductor region;

an electrical transducer disposed upon said first semiconductor region and positioned within said first cavity;

an electrical circuit disposed upon said second semiconductor region and positioned within said second cavity; and at least one electrode connecting said electrical transducer and said electrical circuit.

24. The semiconductor device of claim 1, wherein said substrate is a glass substrate.

25. The semiconductor device of claim 1, wherein said substrate is a dielectric coated silicon layer.

* * * * *